(12) United States Patent
Tso et al.

(10) Patent No.: US 7,664,219 B2
(45) Date of Patent: Feb. 16, 2010

(54) FLIP-FLOP AND SHIFT REGISTER

(75) Inventors: Ko-Yang Tso, Taipei County (TW); Hui-Wen Miao, Hsinchu (TW); Chin-Chieh Chao, Hsinchu (TW)

(73) Assignee: Raydium Semiconductor Corporation, Hsinchu (TW)

( * ) Notice: Subject to any disclaimer, the term of this patent is extended or adjusted under 35 U.S.C. 154(b) by 5 days.

(21) Appl. No.: 12/073,197

(22) Filed: Mar. 3, 2008

(65) Prior Publication Data
US 2008/0253500 A1 Oct. 16, 2008

(30) Foreign Application Priority Data
Apr. 14, 2007 (TW) .............................. 96113259 A

(51) Int. Cl.
G11C 19/00 (2006.01)
(52) U.S. Cl. .................. 377/73; 377/78; 327/208; 327/218
(58) Field of Classification Search ........... 327/202, 327/203, 208, 218; 377/73, 78
See application file for complete search history.

(56) References Cited
U.S. PATENT DOCUMENTS

| | | | | |
|---|---|---|---|---|
| 5,289,518 A | * | 2/1994 | Nakao | 377/81 |
| 5,363,424 A | * | 11/1994 | Fujisawa | 377/69 |
| 6,097,230 A | * | 8/2000 | Bareither | 327/202 |
| 6,418,182 B1 | * | 7/2002 | Suyama et al. | 377/69 |
| 6,630,853 B1 | * | 10/2003 | Hamada | 327/202 |
| 6,778,626 B2 | * | 8/2004 | Yu | 377/69 |
| 6,989,695 B2 | * | 1/2006 | Dike et al. | 327/142 |
| 7,081,778 B2 | * | 7/2006 | Ueda et al. | 327/141 |
| 7,420,391 B2 | * | 9/2008 | Pesci | 326/46 |

FOREIGN PATENT DOCUMENTS

| | | | |
|---|---|---|---|
| JP | 1286609 | * | 11/1989 |
| JP | 4306013 | * | 10/1992 |

* cited by examiner

Primary Examiner—Tuan Lam
(74) Attorney, Agent, or Firm—Rabin & Berdo, P.C.

(57) ABSTRACT

A flip-flop is provided. The flip-flop is used in a shift register in a source driver. The flip-flop is used to receive a first clock signal, an input signal and output an output signal. The output signal is fed back to the flip-flop. The flip-flop includes a flop core for receiving the input signal and output the output signal. When the input signal and the output signal are all disabled, the flop core is disabled to function. When the input signal or the output signal is enabled, the flop core is enabled to function to output the output signal.

4 Claims, 3 Drawing Sheets

FLIP-FLOP AND SHIFT REGISTER

This application claims the benefit of Taiwan application Serial No. 96113259, filed Apr. 14, 2007, the subject matter of which is incorporated herein by reference.

BACKGROUND OF THE INVENTION

1. Field of the Invention

The invention relates in general to a flip-flop, and more particularly to a flip-flop for a shift register of a data driver.

2. Description of the Related Art

FIG. 1 shows a schematic diagram of part of a shift register for a data driver. The shift register in FIG. 1 includes a number of conventional flip-flops. The flip-flop 110 in FIG. 1 receives an initial data signal DT and enables a data signal Q1 according to the input clock signal CK1 during a clock period. After the flip-flop 120 receives the enabled data signal Q1, the flip-flop enables the next data signal Q2 during the next clock period for the next flip-flop 130. The functions of the other flip-flops are the same as that of the flip-flop 120. The shift register outputs an enabled data signal to its next circuit, e.g., a line latch, during each clock signal, so as to latch the correct pixel data.

Thus, during each clock period, only two neighboring flip-flops have to work, one of which is for outputting an enabled data signal, and the other is for receiving the data signal. For example, during a clock period, only the flip-flop 110 generates the enabled data signal to the flip-flop 120. Thus, only the flip-flops 110 and 120 have to work, while the other flip-flops do not. In contrast, all the flip-flops in a conventional shift register work whether not each one of them is needed at a time, causing unnecessary power consumption.

SUMMARY OF THE INVENTION

The invention is directed to a flip-flop for a shift register in a data driver. The flip-flop determines whether its input signal and its fed-back output signal are enabled or not, so as to control its flop core whether or not to work. In the shift register, only the flop core of the flip-flops receiving and generating the enabled data signal would work, while the flop cores of the other flip-flops would not work. Therefore, the power consumption of the shift register is reduced significantly.

According to a first aspect of the present invention, a flip-flop is provided. The flip-flop is used in a shift register of a data driver. The flip-flop is used to receive a first clock signal, an input signal and output an output signal. The output signal is fed back to the flip-flop. The flip-flop includes a flop core. The flop core receives the input signal, and outputs the output signal. The flop core does not work when the input signal and the output signal are both disabled. The flop core works when one of the input signal and the output signal is enabled, so as to output the output signal.

According to a second aspect of the present invention, a shift register is provided. The shift register includes N flip-flops. Each of the flip-flops receives a first clock signal, an input signal and outputs an output signal. Each of the output signals is fed back to each of the flip-flops. Each of the flip-flops includes a flop core. The flop core in each flip-flop receives the input signal and outputs the output signal. The flop core does not work when the input signal and the output signal are both disabled. The flop core works when one of the input signal and the output signal is enabled, so as to output the output signal. The output signal of the i-th flip-flop of the N flip-flops is transmitted to the (i+1)-th flip-flop of the N flip-flops as the input signal of the (i+1)-th flip-flop. The number N is an integer. The number i is an integer smaller than N.

The invention will become apparent from the following detailed description of the preferred but non-limiting embodiments. The following description is made with reference to the accompanying drawings.

DETAILED DESCRIPTION OF THE INVENTION

Figure 1:
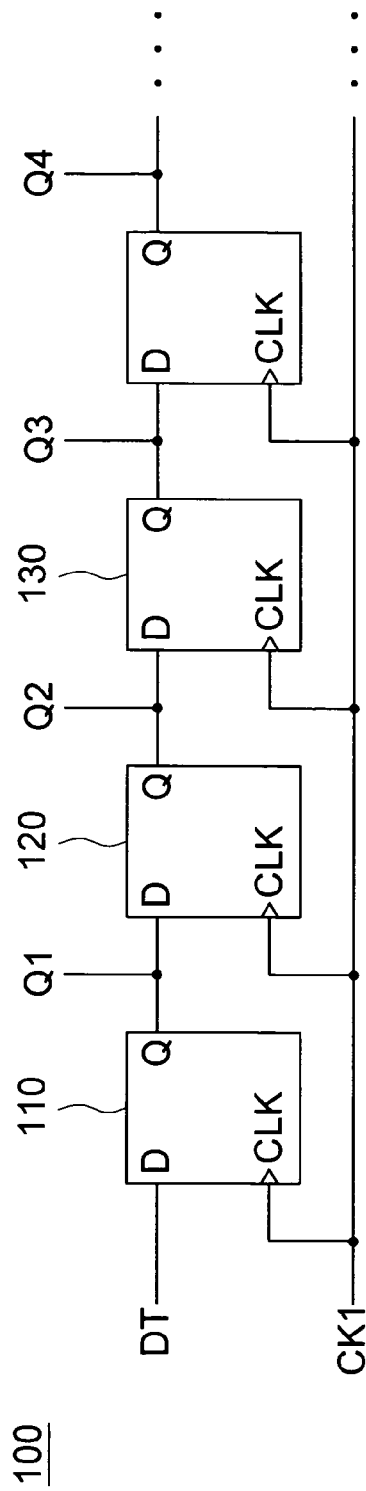
FIG. 1 shows a scheme of part of a conventional shift register in a data driver.
Figure 2:
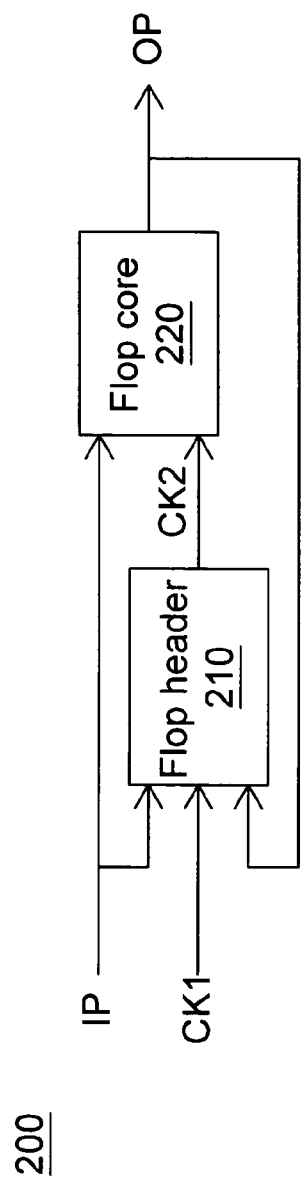
FIG. 2 shows a block diagram of the flip-flop according to an embodiment of the invention.

FIG. 2 shows a block diagram of a flip-flop 200 according to the embodiment. The flip-flop 200 according to the embodiment is used in the data driver of a LCD. The flip-flop 200 receives a clock signal CK1, an input signal IP, and generates an output signal OP. The output signal OP is fed back to the flip-flop 200. The flip-flop 200 includes a flop core 220 for receiving the input signal IP, and outputting the output signal OP. When the input signal IP and the output signal OP are both disabled, the flop core does not work. When at least one of the input signal IP and the output signal OP is enabled, the flop core works, so as to generate the output signal OP.

The flip-flop further includes a flop header 210. The flop header 210 receives the input clock signal CK1, the input signal IP and the fed-back output signal OP. The flop header 210 generates an internal clock signal CK2 according to the output signal OP and the input signal IP. The flop core 220 receives the internal clock signal CK2 and the input signal IP, and outputs the output signal OP. The output signal OP is fed back to the flop header 210.

When the input signal and the output signal of the flip-flop 200 are both disabled, which means the flip-flop 200 does not switch states, the flip-flop 200 does not have to work. At this moment, the flop header 210 receives the disabled input signal IP and the fed-back output signal OP, and disables the internal clock signal CK2 accordingly. Thus, whether the input clock signal CK1 is at high level or low level, the internal clock signal CK2 maintains the same level, so that the flop core does not work. The power consumption in the shift register is thereby reduced.

When the flip-flop 200 is to receive the enabled input signal IP or is to generate the enabled output signal OP, it has to work. At this moment, the flop header 210 generates the internal clock signal CK2 corresponding to the input clock signal CK1. Thus, the flop core 220 generates the output signal OP according to the internal clock signal CK2 and the input signal IP.

In the shift register, the input signal IP of the flip-flop 200 can be the output signal generated by its preceding flip-flop. The output signal OP of the flip-flop 200 can be the input signal received by its following flip-flop.

Figure 3:
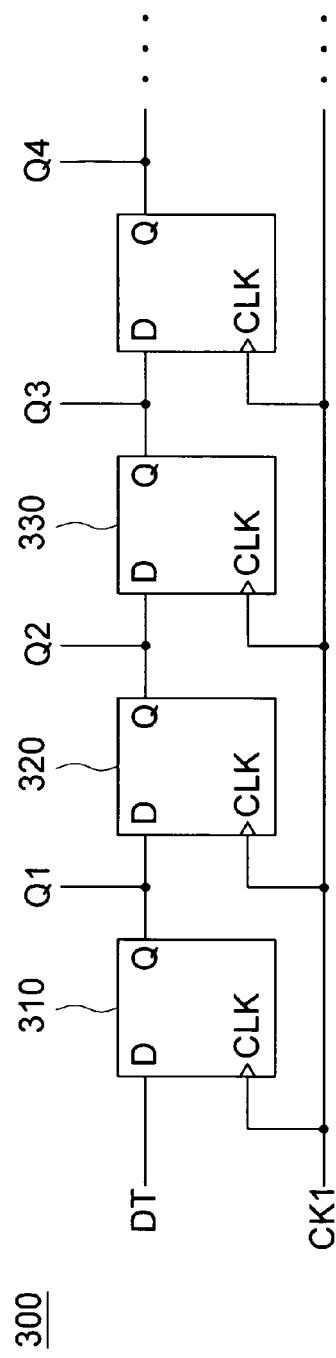
FIG. 3 shows a scheme of part of a shift register according to an embodiment of the invention.

FIG. 3 shows the schematic diagram of the shift register according to the embodiment. The schematics of all flip-flops in the shift register 300 in FIG. 3 are the same as that of the flip-flop 200. All flip-flops in the shift register 300 receive the input clock signal CLK. FIG. 3 shows only the flip-flops 310 and 320.

The flip-flop 310 receives the enabled data signal DT during a first clock period, enabling the flip-flop 310. Thus, the flop header of the flip-flop 310 outputs the internal clock signal corresponding to the input clock signal CLK to the flop core of the flip-flop 310. Thus, when the flip-flop 310 receives the enabled input signal, its flop core will work normally.

At the same time, since the input signal and the output signal of the flip-flop 320 are both disabled, the flop header of the flip-flop 320 disables its internal clock signal. Thus, the flop header of the flip-flop 320 does not work, reducing the power consumed by the shift register.

Afterward, during a second clock period, the flip-flop 310 outputs an enabled data signal Q1, enabling the flip-flop 310. The flop header of the flip-flop 310 receives the fed-back enabled output signal, and outputs the internal clock signal corresponding to the input clock signal CLK to the flop core of the flip-flop 310, thereby keeping the flop core of the flip-flop 310 working continuously.

Meanwhile, the data signal DT is switched to disabled, thereby disabling the flip-flop 310.

During the second clock period, the flip-flop 320 receives the enabled data signal Q2, thereby enabling the flip-flop 320. The flop header of the flip-flop 320 outputs the internal clock signal corresponding to the input clock signal CLK to the flop core of the flip-flop 320. Thus, during the second clock period, the flip-flop 310, which generates the enabled data signal Q1, and the flip-flop 320, which receives the enabled data signal Q1, both work.

Afterward, during a third clock period, since the data signal DT is switched to disabled, the data signal Q1 generated by the flip-flop 310 is also switched to disabled, disabling the flip-flop 310. Hence, the input signal and the fed-back output signal of the flip-flop 310 are both disabled. The flop header of the flip-flop 310 thus disables the internal clock signal, so that the flop core of the flip-flop 310 stops work.

Meanwhile, during the third clock signal, the flip-flop 320 generates the enabled data signal Q2 to the flip-flop 330. At the same time, the flop cores of the flip-flops 320 and 330 both work. The function of the flip-flops 320 and 330 are the same as the discussed above, and the explanation is not repeated.

From the above disclosure, only one of two neighboring flip-flops generates an enabled data signal, and the other receives the enabled data signal during each clock period. The flip-flop in the embodiment determines whether or not its input signal and its fed-back output signal are enabled, so as to determine when the flop core will work. Thus, in the shift register, only flop heads of flip-flops receiving or generating an enabled data signal work, while flop headers of other flip-flops do not work. As a result, the shift register applied the flip-flop according to the embodiment is able to reduce its power consumption significantly.

Figure 4:
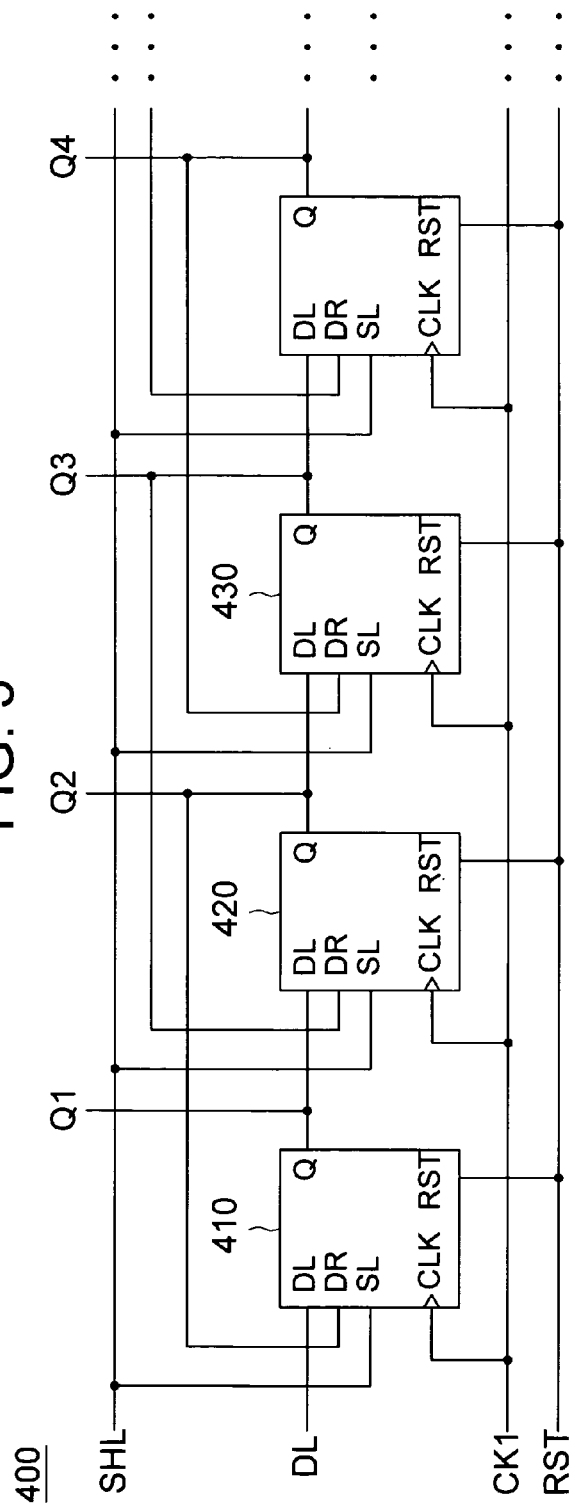
FIG. 4 shows a scheme of part of a bidirectional shift register.

FIG. 4 shows the schematic diagram of part of the shift register 400 according to another embodiment. The shift register 400 is a bidirectional shift register. All flip-flops in the bi-directional shift register receive one control signal SHL, an input clock signal CK1, and a reset signal RST. The control signal SHL is used to select the transmitting direction of the data signal. In the bi-directional shift register 400, the left-most flip-flop, i.e., the flip-flop 410, receives the data signal DL, while the right-most flip-flop (not shown) receives the data signal DR (not shown).

The function of the shift register 400 is exemplified by the function of the flip-flops 410, 420 and 430. The flip-flop 420 selects one of the data signals Q1 outputted by its preceding flip-flop 410 or the data signal Q3 outputted by its following flip-flop 430 according to the control signal SHL. When the data signal from the preceding flip-flop is selected according to the control signal SHL, the flip-flop 420 receives the data signal Q1 and outputs the data signal Q2 to the flip-flop 430 according to the data signal Q1 and the input clock signal CK1. And when the data signal from the following flip-flop is selected according to the control signal SHL, the flip-flop 420 receives the data signal Q3 and outputs the data signal Q2 to the flip-flop 410 according to the data signal Q3 and the input clock signal CK1.

Figure 5:
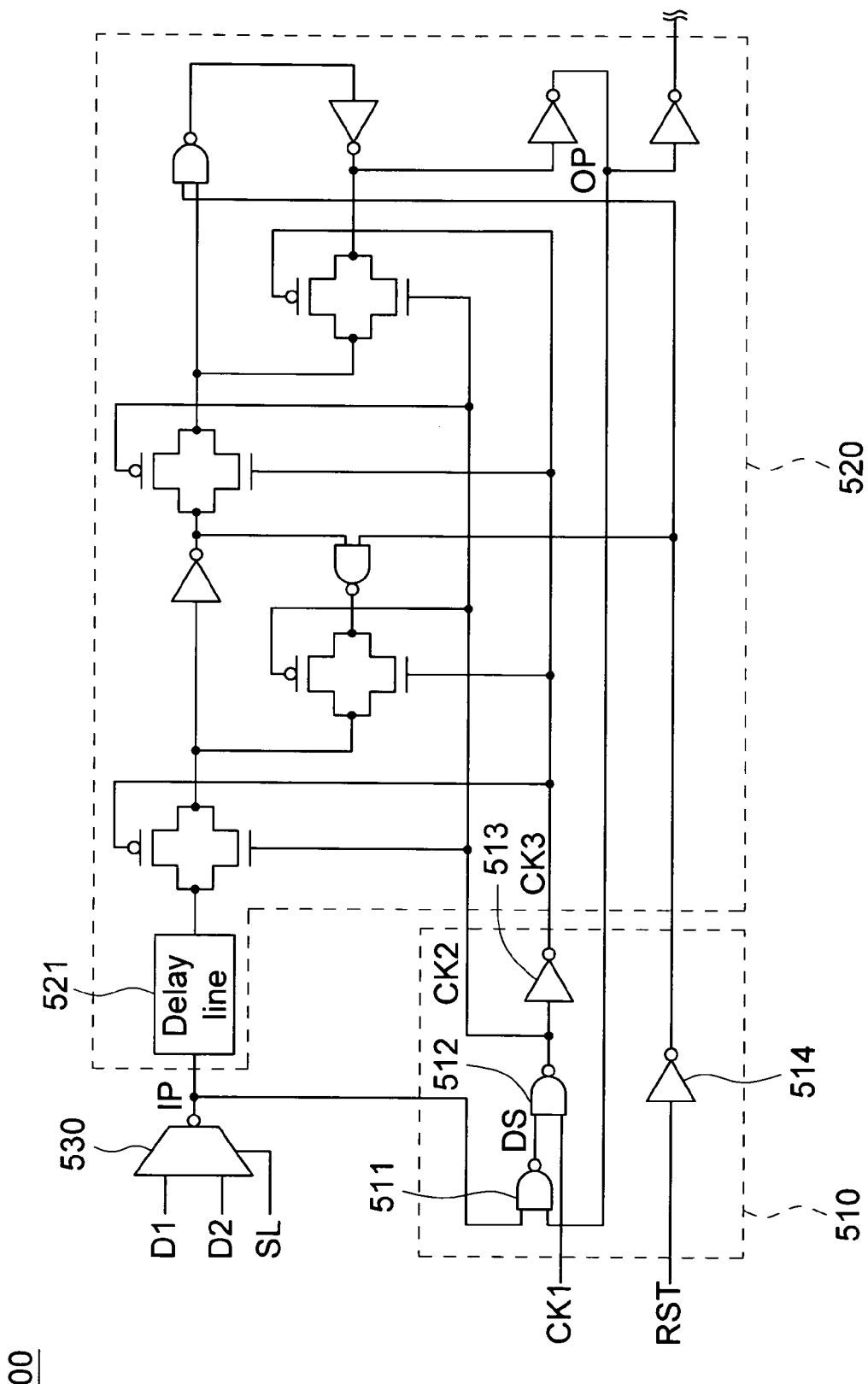
FIG. 5 shows a circuit diagram of a flip-flop according to another embodiment of the invention.

FIG. 5 shows the circuit diagram of the flip-flop 500 according to another embodiment. The scheme of the flip-flop 500 is the same as the ones of the flip-flops 410 to 430 in the shift register 400. The flip-flop 500 includes a flop header 510, a flop core 520 and a multiplexer 530.

The multiplexer 530 receives the control signal SL and two data signals D1 and D2. The data signals D1 and D2 are data signals transmitted from two neighboring flip-flops of the flip-flop 500. In the embodiment, the multiplexer 530 selects and inverts one of the two data signal D1 and D2 to generate the input signal IP according to the control signal SHL.

The flop header 510, which is the same as the flop header in FIG. 2, receives the input clock signal CK1, the input signal IP and the output signal OP fed back from the flop core 520, and outputs the internal clock signal to the flop core 520 according to whether or not the input signal IP and the output signal OP are enabled. The flop core 520 receives the internal clock signal CK2 and the input signal IP, and outputs the output signal OP. The output signal OP is then fed back to the flop header 510.

In the same way as the flip-flop in FIG. 2, when the input signal IP and the output signal OP of the flip-flop 500 are both disabled, the flop header 510 disables the internal clock signal CK2, so that the flop core 520 does not work, thereby reducing the power consumed by the flip-flop 500. When the flip-flop 500 receives the enabled input signal IP or outputs the enabled output signal OP, the flop header 510 generates the internal clock signal CK2 corresponding to the input clock signal CK1, so that the flop core 520 can generate the output signal OP according to the internal clock signal CK2 and the input signal IP.

In the embodiment, the flop header 510 includes two NAND gates 511 and 512. The NAND gate 511 receives the input signal and the output signal fed back from the flop core 520, and accordingly outputs a determining signal DS to the NAND gate 512. The NAND gate 512 receives the determining signal DS and the input clock signal CK1 and generates the internal clock signal CK2 accordingly.

In the embodiment, when the input signal IP and the output signal OP are both disabled, the input signal IP and the output signal OP are logic 1. Otherwise, the output signal OP is logic 0. When the input signal IP and the output signal OP is both disabled, the NAND gate 511 outputs the determining signal to be logic 0. At this same time, no matter whether the input clock signal CK1 is high level (logic 1) or low level (logic 0), the internal clock signal CK2 maintains the same level so that the flop core 520 does not work.

When one of the input signals IP and the output signal OP are enabled, the NAND gate 511 outputs the determining signal to be logic 1. At this same time, the internal clock signal CK2 changes its level according to the input clock signal CK1 so that the flop core 520 works.

In addition, the flop header 510 further includes an inverter 513. The inverter 513 inverts internal clock signal CK2 to output another internal clock signal CK3 to the flop core 520.

In addition, the flop header 510 further receives a reset signal RST to reset the flip-flop 500. The flop header 510 further includes an inverter 514 to receive the reset signal RST.

Also, the flop core 520 includes a delay line 521 for increasing the hold time margin of the flop core 520.

The flop header in the embodiment is not limited to the combination of the logic gates discussed above. Any flop headers which use an internal clock signal to control the working of the flop core according to the signals from flip-flips and the output signal fed back from the flop cores and thus saves power, is within the scope of the invention.

In the flip-flop according to the embodiment, the flop header determines whether the input signal of the flip-flop and the output signal fed back from the flop core are enabled, thereby determining whether the flop core works or not. When the input signal and the output signal of the flip-flop are both disabled, the flop header disables the internal clock signal which, in turn, disables the working of the flop core. When the flip-flop receives the enabled input signal or generates the enabled output signal, the flop header generates the internal clock signal corresponding to the input clock signal, so that the flop core can output the output signal according to the internal clock signal and the input signal.

Hence, in the shift register which has the flip-flops disclosed above, only the flop core of the flip-flops receiving and generating the enabled data signal works, while the flop cores of the other flip-flops do not. On the contrary, in a conventional shift register, all flop cores work all the time whether or not the flip-flops receive or generate the enabled data signal. Conventional shift registers thus unnecessarily consume power. Therefore, the power consumption of the shift register according to the embodiment is minimized.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A flip-flop for a shift register of a data driver, the flip-flop for receiving a first clock signal, an input signal and outputting an output signal, the output signal being fed back to the flip-flop, the flip-flop comprising:

a flop core for receiving the input signal and outputting the output signal, wherein the flop core is in power-saving when the input signal and the output signal are both disabled, the flop core outputs the output signal when one of the input signal and the output signal is enabled, and the flop core outputs the output signal when both of the input signal and the output signal are enabled; and a flop header for receiving the first clock signal, the input signal, and the fed-back output signal, and outputting a second clock signal according to the output signal and the input signal, wherein when the input signal and the output signal are both disabled, the second clock signal is in a first state, when one of the input signal and the output signal is enabled, the second clock signal is in a second state, and when both of the input signal and the output signal are enabled, the second clock signal is in the second state, wherein the flop core receives the second clock signal and the input signal and outputs the output signal, when the second clock signal is in the first state, the flop core does not work, and when the second clock signal is in the second state, the flop core works and generates the output signal which is fed back to the flop header.

2. The flip-flop according to claim 1, wherein when the input signal and the output signal are both disabled, the second clock signal maintains at the same level whether the first clock signal is high-level or low-level, whereby the flop core does not work.

3. The flip-flop according to claim 1, wherein:

the flop header comprises a first NAND gate, for receiving the input signal and the output signal and generating a determining signal, a second NAND gate, for receiving the first clock signal and the determining signal and generating the second clock signal, and an inverter, for inverting the second clock signal to generate a third clock signal; and the flop header further receives a reset signal to reset the flip-flop.

4. The flip-flop according to claim 1, wherein the flop core further comprises a delay line for increasing the hold time margin of the flop core.

* * * * *